United States Patent [19]
Golecki et al.

[11] Patent Number: 5,348,774
[45] Date of Patent: Sep. 20, 1994

[54] METHOD OF RAPIDLY DENSIFYING A POROUS STRUCTURE

[75] Inventors: Ilan Golecki, Parsippany; Robert C. Morris, Ledgewood; Dave Narasimhan, Flemington, all of N.J.

[73] Assignee: AlliedSignal Inc., Morris Township, Morris County, N.J.

[21] Appl. No.: 104,703

[22] Filed: Aug. 11, 1993

[51] Int. Cl.⁵ .............................................. C23C 16/00
[52] U.S. Cl. ................................. 427/543; 427/113;
427/228; 427/249; 427/255.6; 427/237;
427/238; 427/294; 427/314; 427/331;
427/374.2; 427/544; 427/547; 427/590;
427/591; 427/595
[58] Field of Search ................... 427/113, 249, 255.6,
427/237, 238, 294, 314, 331, 374.2, 228, 543,
544, 547, 590, 591, 595

[56] References Cited

U.S. PATENT DOCUMENTS 4,472,454 9/1984 Houdayer et al. ............... 427/45.1

OTHER PUBLICATIONS

Kotlensky, "A Review of CVD Carbon Infiltration of Porous Substrates", Proc. 16th. Nat. Symposium of the Soc. of Aerospace, Mat. & Proc. Eng., Apr. 1971.
Lieberman et al., "CVD/PAN Felt Carbon/Carbon Composites", Composite Materials, vol. 9, Oct. 1975, p. 337.
Lieberman & Noles, "Gas Analysis During the Chemical Vapor Deposition of Carbon" Proc. 4th Int. Conf. on Chem. Vapor Dep., Boston, Mass., Oct. 1973, pp. 19-29.
Stoller et al, "Carbon Fiber Reinforced-Carbon Marix Composites", Proc. 1971 Fall Meet. of the Met. Soc. of AIME, Detroit, Mich., Met. Soc. of AIME, 1974, pp. 69-136 (month not available).
Bristow & Hill, "The Development of a Plant for the Production of Carbon/Carbon Composites . . . ", Inst. Chem. Eng., London, England, Symp. Ser. 43, 1975, pp. 5-5 through 5-11 (month not available).

Primary Examiner—Bernard Pianalto
Attorney, Agent, or Firm—Gerhard H. Fuchs

[57] ABSTRACT

Porous solid bodies, especially carbon bodies, are densified by chemical vapor deposition by establishing a thermal gradient within the body, thermally decomposing a gaseous precursor so deposit an electrically and thermally conductive deposit (e.g. carbon) within the body, and shifting the thermal gradient toward the lower temperature zone as deposition proceeds, by means of induction heating.

10 Claims, 4 Drawing Sheets

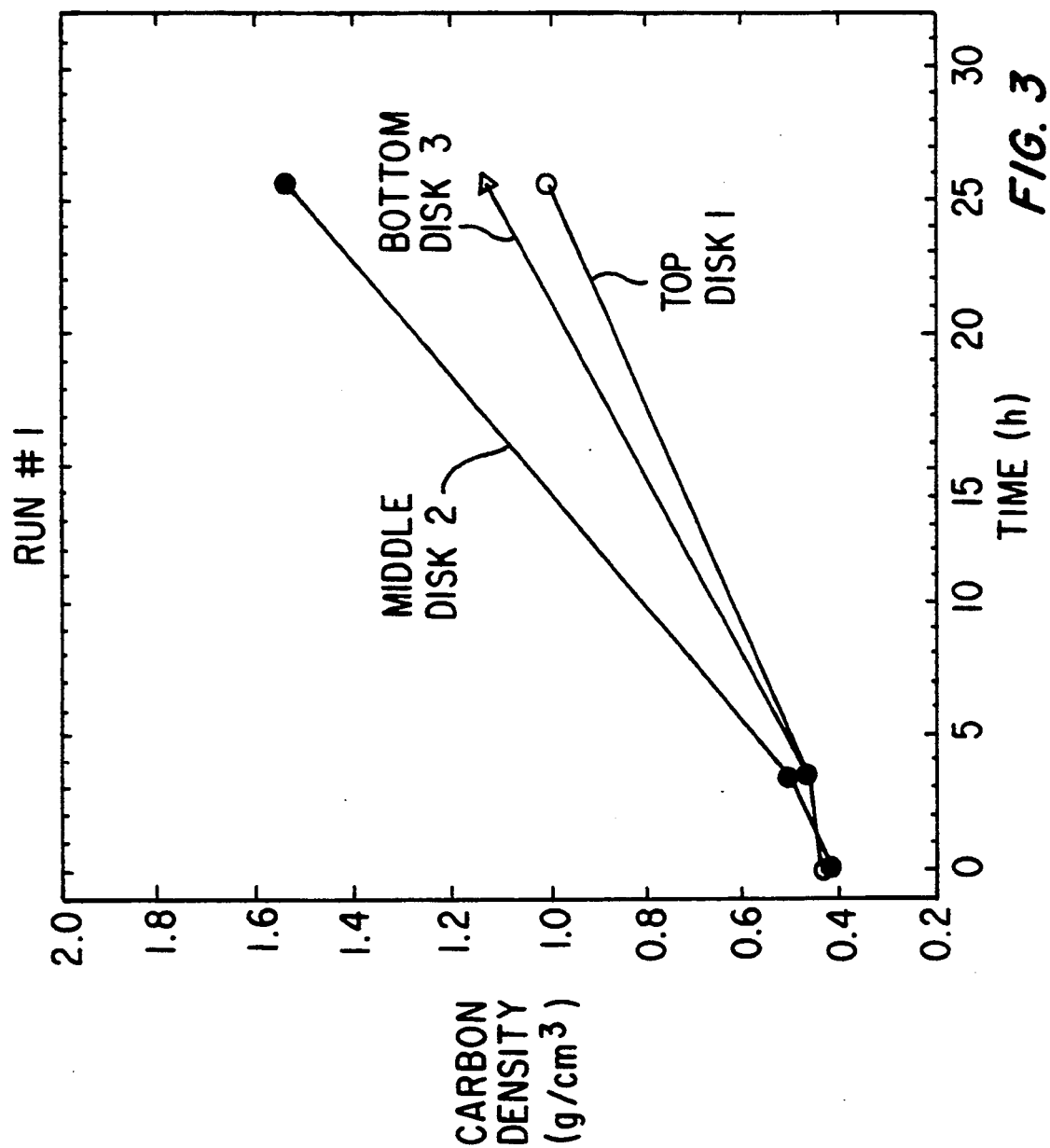

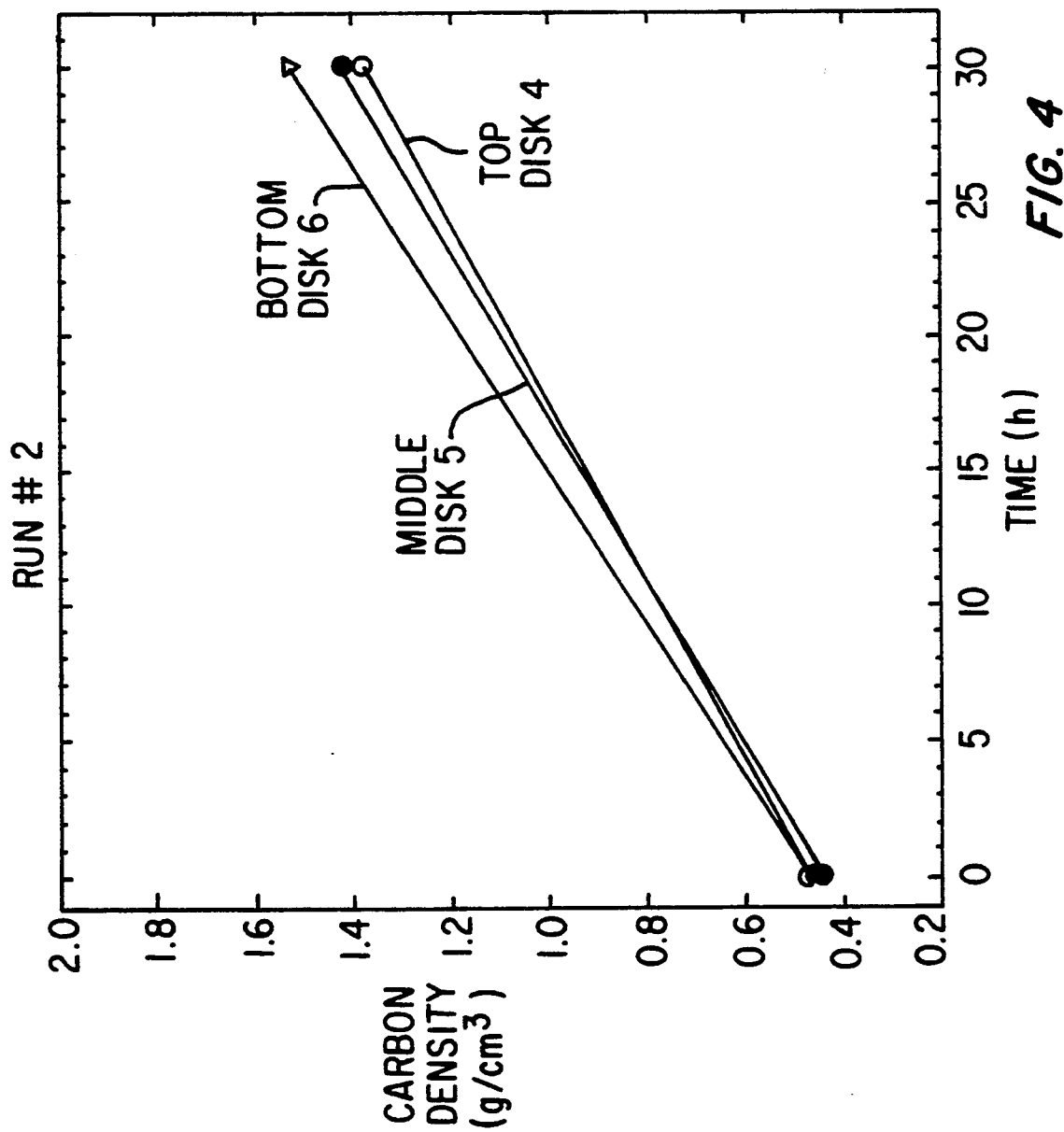

METHOD OF RAPIDLY DENSIFYING A POROUS STRUCTURE

FIELD OF THE INVENTION

This invention relates generally to the field of densification and infiltration of porous structures, especially carbon-carbon, by chemical vapor deposition and infiltration (CVD, CVI), and to structural components utilizing such structures, for example brake pads for aircraft.

BACKGROUND OF THE INVENTION

Composite materials, such as carbon-carbon, offer advantages of light weight and good mechanical properties for a variety of aerospace and other applications, such as brake pads and uncooled engine and other airplane parts. One of the most common fabrication methods of such composite structures involves densification of a porous body having the approximate desired shape by means of chemical vapor deposition (CVD) and infiltration (CVI). This method involves flowing a stream of vapor containing the desired element or compound over and around the part to be densified, while that part is kept at a temperature sufficient to decompose the precursor vapor. Under the appropriate conditions, the precursor decomposes in such a way as to produce the desired element or compound within the pores of the part, thus increasing its density.

The densification rate usually increases with increasing precursor partial pressure and increasing substrate temperature. For practical reasons, it is desirable to reduce the processing time, or equivalently increase the densification rate, as much as possible. On the other hand, the microscopic structure and corresponding macroscopic properties of the densified material, such as friction and wear rate, vary with deposition temperature and other conditions. Furthermore, increasing the pressure and/or temperature may produce undesirable homogeneous nucleation of powders in the gas phase (soot formation in the case of carbon compounds) instead of inside the pores of the substrate, leading to closure of the surface pores, and thus hindering further densification.

A common application of CVD/CVI involves densification of porous carbon substrates. Typically, a large number of such substrates are placed in an enclosure uniformly heated to a temperature of about 1000° C. and exposed to a stream of precursor vapor, e.g. methane. This approach is known as hot-wall CVD, since the walls of the reaction vessel are kept at or slightly above the substrate temperature. In this procedure, each substrate is at a uniform temperature throughout its volume. This procedure has the major drawback of extremely long cycle time, of the order of 600-1200 h to achieve desired degree of densification. The main reason for this is that the pressure and temperature inside the reactor must be kept relatively low, in order to produce the desired carbon microstructure, e.g. so-called rough laminar or smooth laminar and to prevent homogeneous nucleation in the gas phase with soot formation. Furthermore, the process usually must be interrupted at least once, and often several times, to permit grinding of the substrate exterior surfaces in order to open clogged surface pores. Without intermediate grinding operation, the desired density cannot be achieved. Also, it is not possible to measure the endpoint of the reaction and the process is stopped after a pre-set time. Thus, substrates may not be completely or optimally densified and the time at temperature may be unnecessarily lengthened, resulting in wasted resources and added cost.

It has already been proposed to reduce the CVD cycle time, utilizing approaches termed "thermal-gradient CVI".

Kotlensky (Proc. 16th National Symposium of the Society of Aerospace, Material and Process Engineers, Anaheim, Calif. Apr. 1971 pp. 257-265.14)) describes a thermal-gradient CVI process in which a porous carbon-carbon substrate is placed on a side of a hexagonal graphite mandrel (receptor) which is heated by an induction coil driven at 3 kHz. The substrate does not have circumferential continuity around the mandrel and thus cannot couple to the coil. The porous carbon substrate also has a much lower electrical conductivity than the mandrel. The substrate is heated by thermal radiation from the mandrel. Due to the very low thermal conductivity of the porous carbon substrate and the radiation heat loss from the opposite surface of the substrate to the water-cooled coil and water-cooled chamber walls, that opposite surface is at a much lower temperature. Thus, a significant thermal gradient is established across the substrate, which enables heating the hot surface to higher temperatures than used in isothermal CVI, without immediate pore closure. Carbon is deposited first (mainly) in the hottest portion of the substrate. As that portion of the substrate becomes denser, its thermal conductivity increases somewhat, causing a decrease in the temperature gradient. Thus the temperature increases somewhat with time through the substrate, from the surface adjacent to the mandrel towards the opposite surface. However, since the heating of the substrate still depends primarily on heat radiation from the mandrel, the temperature in those portions of the substrate further from the mandrel is lower than that in the region adjacent to the mandrel. Thus, although the local, microscopic deposition rate is higher initially in the hot region adjacent to the mandrel, the overall process is still relatively slow. Additionally, since this process is run at a pressure of 1 atm (760 Torr at sea level), substantial amounts of undesirable soot and tar are formed by homogeneous nucleation in the gas phase, even inside the pores of the substrate, resulting in a material which has lower thermal and electrical conductivity, which is less graphitizable and has degraded mechanical properties.

Lieberman and Noles (Proc. 4th Int. Conf. on Chemical Vapor Deposition, Boston, Mass., Oct. 1973 pp. 19-29), Stoller et al. (Proc. 1971 Fall Meeting of the Metallurgical Soc. of AIME, Detroit, Mich., published in Weeton and Scala, Eds. "Composites: State of the Art", Met. Soc. of AIME [1974]pp. 69-136), and Lieberman et al. (J. Composite Materials 9 337-346 [1975])) describe a thermal-gradient CVI process, in which a porous carbon-carbon felt is mounted around a truncated-conical graphite susceptor which is heated by a conical-shaped induction coil. The felt, which is initially flat, is made into a truncated hollow cone by sewing with a nylon thread along the entire length of the cone. Since nylon is electrically insulating, there is no induced electrical current around the circumference of the felt and the felt does not couple electrically to the coil. Stoller et at. state that a reduction of a factor of two only is achieved in cycle time, compared to the isothermal process, and that the technique is limited to densifying one item at a time. This process also suffers from soot formation inside the pores of the felt-substrate, due to the very high temperature and high pressure employed. The rate of densification is again not much faster than achieved in the isothermal process because the heating of the felt depends primarily on thermal radiation from the mandrel, just as in Kotlensky's process.

Houdayer et al. in U.S Pat. 4,472,454 describe a method for rapid densification of porous annular carbon parts by placing such parts around a cylindrical conducting susceptor, immersing this assembly in a liquid precursor, preferably cyclohexane, and heating the parts by induction to a temperature sufficient to cause the liquid to vaporize and deposit carbon inside the pores of the parts. These authors claim that this carbon densification process takes approximately 1/100 of the time to complete compared to densification from the vapor phase by prior art and that the parts densified by their process have a texture and physical characteristics identical to those obtained accordinc to the prior art. This approach requires immersion in a liquid precursor, which is limiting for practical applications. The large thermal gradient imposed on the substrate by heat loss through the boiling precursor liquid prevents the outer portions of the substrate from ever attaining a temperature sufficiently high to produce CVD carbon. This results in the outer portions of the substrate having significantly lower density than the inner portions, requiring corresponding oversizing of the substrate. Since the central susceptor is the sole heat source, the quality and microstructure of the carbon deposited in the substrate along the radial direction is not constant. For example, scale-up of this process to densify a 21 inch (53.3 cm) outer diameter substrate appears very difficult, because of the large power supplies and cooling facilities required.

Finally, Bristow and Hill (Inst. Chem. Eng., London, England, Symp. Set. 43 [1975]pp. 5—5 through 5-11) teach against using an induction coil to densify porous carbon-carbon composites by thermal-gradient chemical vapor deposition. They claim that an induction heating arrangement may cause the process to run out of control. They describe a process using a central resistance heater and do not mention any advantage in reduced cycle time.

SUMMARY OF THE INVENTION

To overcome shortcomings of the prior art, the present invention provides a method for densifying a porous solid structure by infiltration with a gaseous compound which upon thermal decomposition forms a solid, conducting residue, and thermally decomposing the compound within the pores of the structure, by the method which includes the steps of:
a) establishing a thermal gradient within and across the porous structure;
b) infiltrating the porous structure with a gas comprising the thermally decomposable compound, to effect deposition of solid, conducting residue predominantly at the higher temperature zone within the porous structure; and
c) progressively shifting the higher temperature zone toward the lower temperature zone as deposition of the solid, conducting residue proceeds, while maintaining the thermal gradient, by subjecting the densified zone to electromagnetic radiation at a frequency which inductively couples to the densified zone of the porous solid body.

As used herein, unless otherwise noted, the term "conducting" means sufficiently electrically conducting to couple to an electromagnetic field for induction heating.

The method is conveniently practiced in a reaction vessel having cooled walls, usually water cooled walls (cold wall reactor)

BRIEF DESCRIPTION OF THE DRAWINGS

With reference to the annexed drawings,
FIG. 3 and FIG. 4 provide the measured density of specific exemplary carbon parts before and after CVI for two specific runs.

DETAILED DESCRIPTION OF THE INVENTION, OF THE PREFERRED EMBODIMENTS, AND OF THE BEST MODE PRESENTLY CONTEMPLATED FOR ITS PRACTICE

While the invention process is particularly suited for densifying porous carbon bodies by deposition of carbon within the pores to provide structural components, such as brake pads for aircraft applications, any porous material can be so densified, provided it is capable of coupling to the electromagnetic radiation. Exemplary materials are the nitrides of aluminum and titanium, boron, silicon, silicon carbide, cubic zirconia and the like.

Pore size and more volume are non critical, so long as the gaseous compound is capable of infiltrating the pores under reaction condition to form a conducting solid residue therein by thermal decomposition.

The gaseous compound may be any one that upon thermal decomposition forms the desired conducting solid residue to fill the pores. In the event carbon is the desired residue, as for formation of carbon/carbon composites, the lower hydrocarbons are generally suitable, the e.g. lower alkanes, straight chain branched or cyclic, having from 1 to about 8 carbon atoms. Methane and cyclopentane are exemplary. Cyclopentane, which is a liquid at room temperature, is preferred because it results in efficient utilization and conversion to carbon.

Vapor pressures of the thermally decomposable gaseous compound within the reaction chamber may vary over wide ranges, from about $1 \times 10^{-3}$ Torr to about 760 Torr. Excessively high compound partial pressures, say in excess of about 800 Torr, are desirably avoided in the case of carbon deposition, to minimize formation of undesirable decomposition products, such as soot and tars.

Figure 1:
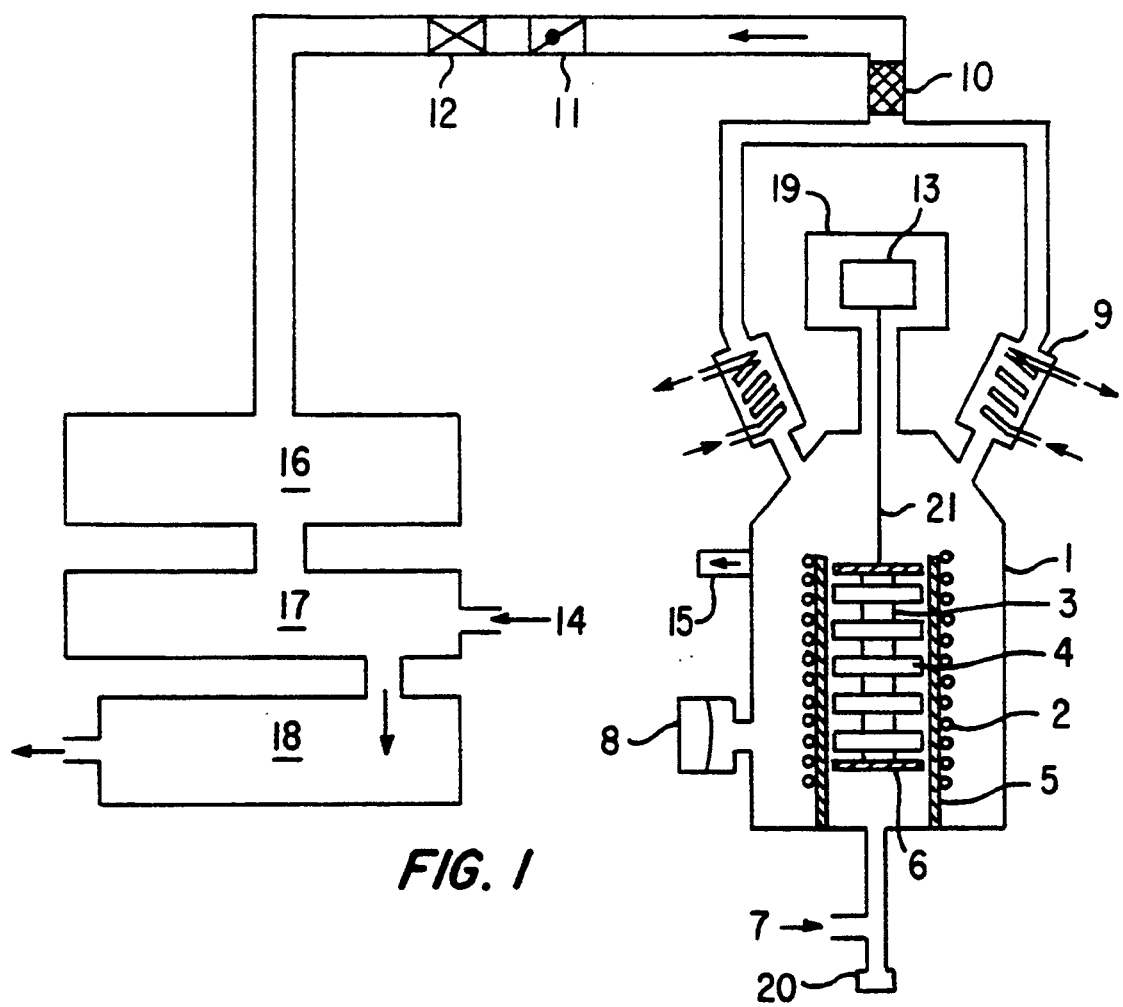
FIG. 1 is a schematic cross-sectional view of a chemical vapor infiltration vessel with associated auxiliaries suitable for the practice of the present invention.
Figure 5:
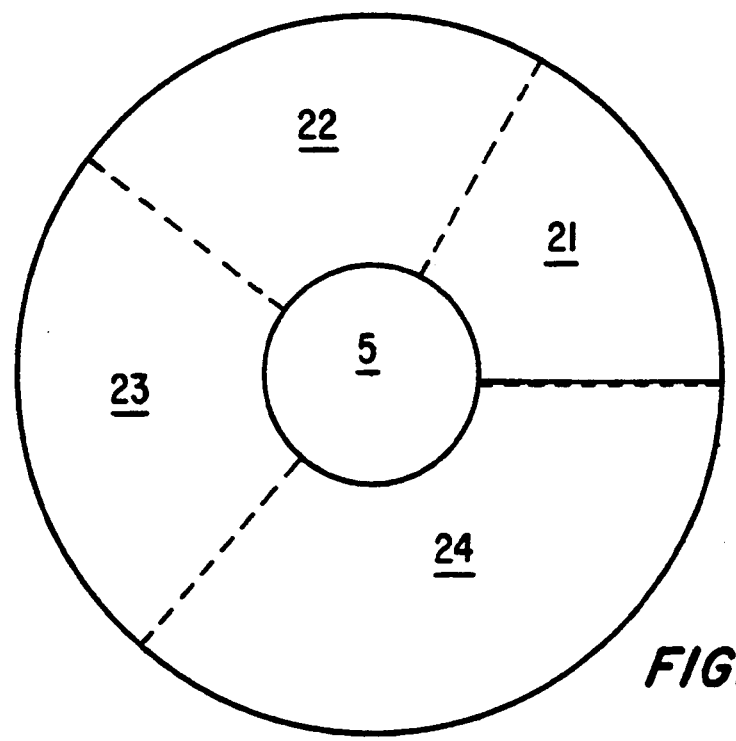
FIG. 5 illustrates schematically the arrangement of an annular body around a susceptor 5. The annular body is composed of 4 segments (referred to by reference numerals 21 through 24) which must be in electrically conductive communication with each other.

By thermal gradient is meant that the temperature of the porous solid body is higher on one side thereof, and gradually declines toward the other side. For an annular body, the temperature would be highest at the inside and lowest at the outside of the annulus. Suitable temperatures and temperature differences will depend on the type of material being densified, the nature of the gaseous compound and its vapor pressure within the reaction chamber. Selection of suitable temperatures is within the ordinary skills of the art. The thermal gradient is conveniently established by conducting the process in a sealed reaction chamber having cooled walls (cold wall reactor) and exposing one side of the material to be densified to a heat source. Desirably, the heat source is a receptor (e.g., graphite body) which is inductively coupled to a source of high frequency electromagnetic radiation (e.g. within the range of from about 60 Hz to about 1000 KHz). The frequency is selected to inductively couple to the densified portions of the porous solid body, to provide heating within the body to shift the temperature gradient as densification proceeds. The body or bodies to be densified are enclosed within the radiation source (usually a water-cooled induction coil and surround the receptor. If a plurality of solid, non-annular bodies are to be densified, they must be in electrical contact with each other, as illustrated in FIG. 5, or else the densified regions will not inductively couple to the electromagnetic field, and the benefits of shifting temperature gradient due to induction heating will not be realized. A plurality of annular bodies can be densified by placing each around the central susceptor, as illustrated in FIG. 1, without the bodies necessarily being in electrical contact. For aircraft brake applications, the porous bodies (herein also referred to as substrates) are desirably of annular construction, and surround the receptor. The substrates densify radially, from the inside out, due to the radial temperature gradient. As the density of the parts increases, so does their electrical conductivity. Thus, the densified regions of the substrates now start coupling to the electric field produced by the induction coil and thereby become directly heated by the electrical current produced by field. Thus the densification front moves radially from the inside out, the coupling and heating by the coil continually improving during the process. This then results in an essentially linear weight gain as a function of processing time, at constant power. By contrast, the state-of-the-art processes produce a much slower and exponential approach to the final weight of the substrates, as noted above, because the heating of the substrates in the state-of-the-art processes is due only to thermal radiation from the mandrel and to thermal conduction through the substrate, which is very small in comparison.

The densification process involved in the invention method is known as chemical vapor infiltration (CVI). The apparatus employed and the operation procedures may be generally described as follows:

Suitable apparatus is illustrated by FIG. 1 of the drawings, which is a schematic view of a cold-wall, thermal-gradient chemical vapor infiltration apparatus for infiltrating and densifying annular porous carbon substrates. The apparatus consists of a water-cooled, 15 inch diameter by approximately 25 inch high stainless steel vacuum chamber 1 onto which are connected a number of ancillary devices. The chamber can be pumped through a butterfly throttle valve 11 and a gate valve 12 by a 350 cfm Roots blower 16, which is backed by a 50 cfm dual-stage mechanical rotary pump 17. A nitrogen gas flow (ballast) may be optionally applied to the rotary pump 17 and its oil reservoir through inlet 14. The nitrogen ballast flow aids in reducing the contamination of the interior of the pump and its oil by condensable by-products. A gaseous or vapor carbon precursor from a gas or vapor delivery line (described in FIG. 2) is let into the chamber through opening 7 on the bottom of the chamber. Alternatively, several gas inlets can be used to distribute the gas more uniformly along the substrates. Different base and working pressures can be reached and stabilized in the chamber, depending on the position of the throttle valve and whether the Roots blower is or is not in operation. A pressure controller enables control of the pressure in the chamber over a wide pressure range (e.g. from below $10^{-2}$ Torr to 760 Torr or 1 atm) by automatically and dynamically adjusting the position of the throttle valve flapper to vary the flow conductance to the pumps. Two throttle valves in series, of different flapper diameters may be used to obtain a wider range of operating pressures. The pressure is measured and the corresponding electrical signal is sent to the pressure controller by an absolute (diaphragm-type) pressure gauge 8; the gauge and associated electronics measures pressure between $1 \times 10^{-3}$ and 1000 Torr. Between the chamber and the pumps there are two cooled tar-traps 9 and a dust-trap 10. The tar-traps consist of triple-wound metal tubing the surfaces of which are exposed to the gases an vapors in the chamber. The construction of the tar-traps forces the vapors to flow around and come in contact with the cooled tubing and prevents direct passage of gas molecules from the chamber to the vacuum tubing above the traps. The tubing is cooled to about $-15°$ C. by flowing a mixture of about 50% ethylene glycol and 50% water through it. The dust trap 10 includes a stainless steel or copper gauze or mesh that mechanically traps particulates. The purpose of the tar and dust traps is to reduce the amount of liquid and solid tar and soot by-products which eventually reach the pumps. Any stable gaseous by-products which flow through the pump, such as methane, ethane and hydrogen, pass through and are oxidized in a burn box 18, which is a hot-wall furnace supplied with flowing air and operated at $700°-1000°$ C. (e.g. $870°$ C.). Alternately, 18 may be a device to separate these stable by-products and recycle them or use them as an energy source. An additional safety device is a pressure-relief valve 15, set for example to 5 psig, which is connected to the entrance of the burn box. Drain 20 at the bottom of the infiltration chamber 1 allows access to and cleaning of the by-products from the chamber.

Inside the vacuum chamber 1, the annular porous carbon-carbon substrates 4 are mounted around a conducting cylindrical mandrel or susceptor 3. The substrates may be mounted with a relatively small clearance and held onto the susceptor by frictional forces. Alternately, they can be mounted with a somewhat larger clearance (such that they would not be self-supporting) and each supported, for example, from below by means of a non-electrically-conducting, thin ceramic (for example alumina) rod or bar. The susceptor can be made, for example, of molybdenum or graphite and can be solid or hollow. The minimum diameter of the solid susceptor and/or the outer diameter and wall thickness of the hollow susceptor are made so as to enable efficient coupling to and heating by an induction (e.g. copper) coil 2, which is connected to and driven by an alternating current (e.g. 2–10 kHz) power supply. The coil is connected to the power supply through a water-cooled vacuum feedthrough, which allows both electrical current and cooling water to flow. The electric field generated by the induction coil inside the susceptor results in essentially circumferentially circulating currents present approximately to a depth δ from the outer surface of the susceptor. This so-called skin depth δ varies as one over the square root of the electrical conductivity of the susceptor material, σ, multiplied by the frequency of the electric field, f:

$$\delta = K/(\sigma f)^{0.5}$$

where K is a constant. For example, for a graphite susceptor ($\sigma \approx 1 \times 10^{-3}$ ohm.cm) and a frequency of 10 kHz, δ is about 1.4 cm; for a molybdenum susceptor ($\sigma \approx 5.3 \times 10^{-6}$ ohm. cm), δ is about 1 mm at 10 kHz. The temperature of the susceptor increases with the power delivered by the power supply to the coil. This power can be set manually and/or controlled automatically. The signal input for automatic control may be the power, measured, for example, by a vacuum thermocouple inside the power supply, or the average temperature(s) inside the susceptor or a substrate, as measured, for example, using securely attached or embedded thermocouples (e.g. Pt-13%Rh/Pt thermocouples). Many substrates (3 to 5 in the apparatus shown in FIG. 1) can be mounted on one susceptor and densified in one run. Insulating heat shields 6, for example quartz plates and/or slotted grafoil carbon plates may be positioned on the top and bottom of the susceptor to reduce the heat losses by radiation to the chamber walls and thereby improve the axial temperature uniformity (along the length) of the susceptor. If grafoil or another electrically conducting material is used, a radial slot prevents it from coupling to the induction coil and thereby generating potentially undesirable heating. An insulating (e.g. quartz) tube 5 may be placed between the substrates 4 and the coil 2. The quartz tube 5 largely confines the flow of precursor vapor or gas to the vicinity of the substrates and thus aids in increasing the efficient utilization of said precursor. The quartz tube also provides electrical and partial thermal insulation between the substrates and the water-cooled coil 2. The susceptor 3 is hung from a support beam 21 at the top of the chamber.

If desired, an in-situ weighing device (e.g. an electronic balance) 13 may be used to continuous monitor the weight of the substrates and susceptor during the densification run. An electric signal proportional to said weight is put out by the balance and said signal or some function of it (e.g. the derivative with respect to time, proportional to the densification rate or rate of weight gain) may be fed into the power supply connected to the coil, and/or to the pressure controller, and/or to the mass flow controller to adjust and optimize the processing conditions (namely, power, pressure and precursor flow rate) in real time. Since most of the active area available for carbon deposition is inside and on the pores of the substrates, the weight gain measured during densification is a direct indication of the progress of the densification process. Only a very small fraction of the carbon is deposited on the relatively small exposed surfaces of the susceptor. Thus, the conditions can be continuously changed in real-time, for example to minimize the CVD cycle time. The balance also allows an accurate determination of the end-point of the infiltration process, by the change in slope of the weight gain as a function of time; that is the slope will decrease when all the open pores in the substrates have been filled. This allows densification time to be minimized for parts of differing surface area and even for parts of different sizes in the same run, without having to carry out time-consuming equipment calibrations. To prevent contamination of the electronic balance with by-products of the reaction, a small flow of an inert gas (for example argon) is maintained around the balance. A second throttle valve (not shown) may be attached to the chamber 19 housing the balance and used to maintain a slightly higher pressure in that chamber 19 than in the main infiltration chamber 1. The balance chamber 19 is thermostated slightly above room temperature to ensure stable operation of the balance.

Figure 2:
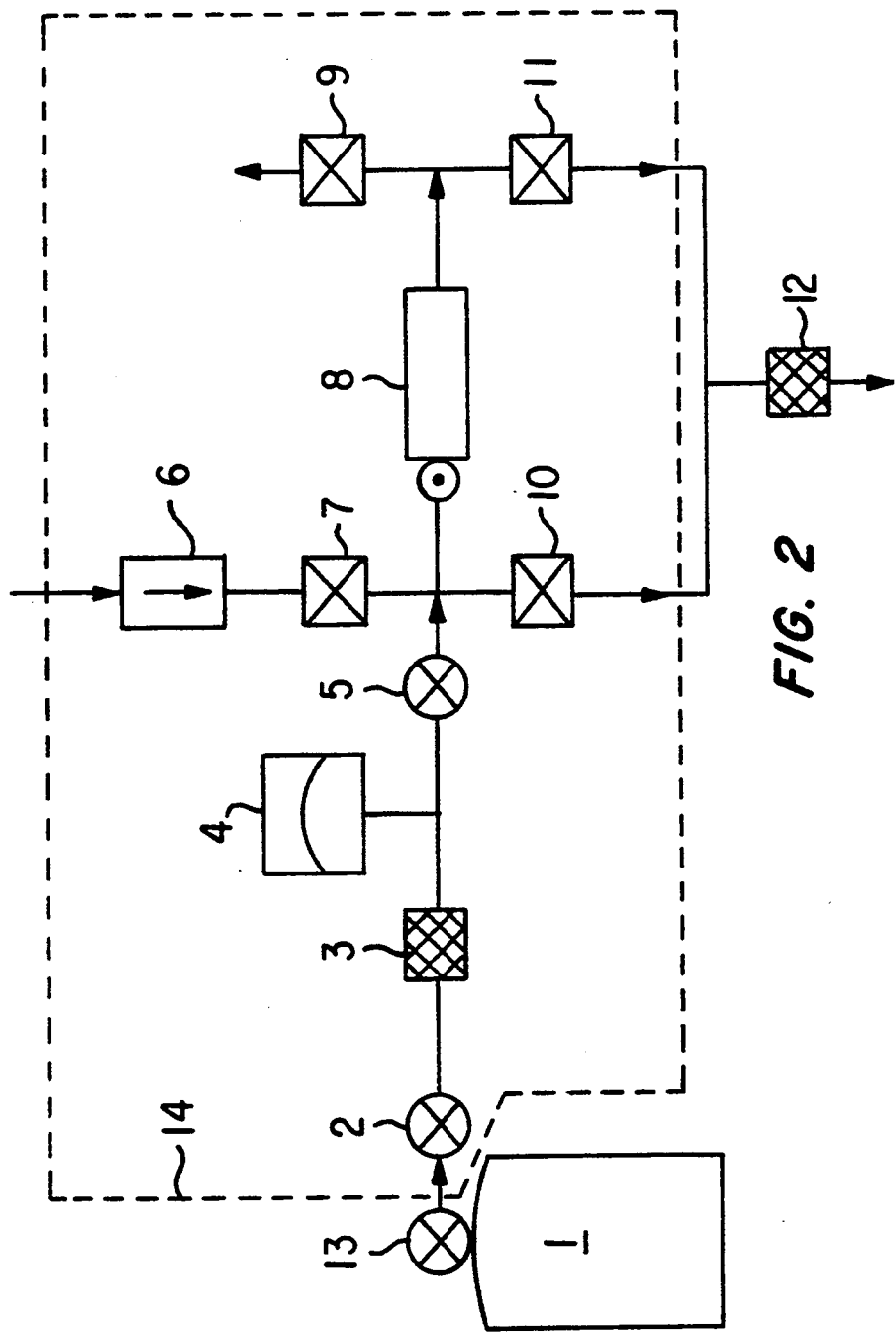
FIG. 2 is a schematic diagram of a vapor delivery system for a chemical vapor infiltration apparatus of the type generally represented by FIG. 1.

FIG. 2 is a diagram of the gas or vapor delivery line used to introduce the carbon-containing precursor into the infiltration chamber (FIG. 1). A pressure vessel 1, typically a steel gas cylinder, contains the liquid or gaseous precursor, for example cyclopentane ($C_5H_{10}$). A manual diaphragm valve 13 controls flow of the precursor from the vessel 1. An excess flow valve 2 acts as a safety device to stop the flow if a pre-set limit in flow-rate is exceeded. A stainless steel mesh filter 3 stops dust and other particles greater than 2 μm. An absolute diaphragm pressure gauge 4 permits measuring the pressure in the line and, under vacuum conditions, the vapor pressure of the liquid precursor. A manual diaphragm valve 5 allows flow of the precursor vapor through the mass flow controller 8. The mass flow controller is used to set a desired precursor flow rate into the infiltration chamber (FIG. 1). Valves 10 and 11 connect through a stainless steel mesh filter 12 to the vacuum pumps, allowing evacuation of the delivery line. Valve 7 allows purging the delivery line with an inert gas, such as argon, through a check valve 6; the check valve prevents the precursor from back flowing and contaminating the inert gas line. Valve 9 allows the precursor vapor to flow into the infiltration chamber (FIG. 1). Valves 7, 9, 10, and 11 are bellows valves which are operated by secondary, solenoid-controlled compressed-air valves (not shown). The entire delivery line, except for the precursor cylinder 1, is contained inside a metallic, thermally insulated enclosure 14, which is thermostated to a temperature above the boiling point of the liquid precursor, for example to approximately 70° C. for cyclopentane, which boils at 50° C. This device and procedure prevents undesirable condensation of the liquid precursor inside the delivery line and/or its elements. Although this vapor delivery line is designed for a liquid precursor, it can be easily modified to accommodate a gaseous precursor, such as methane, by, for example, the addition of a pressure reducing regulator between the filter 3 and the tee junction connecting to the pressure gauge 4.

The entire infiltration apparatus can be remotely and automatically controlled, using for example a personal computer equipped with input/output data boards and appropriate software, since the power (determining the temperature), pressure, precursor flow rate and on-off gas valves are all electrically controlled. By appropriate programming, this infiltration system can use intelligent sensing and processing to vary the process conditions in real time so as to minimize the total cycle time, using weight gain and temperature signals, for example.

An exemplary deposition procedure follow: Mounting porous substrates on a mandrel. Three porous, annular carbon-carbon substrates, each 4.12 inch in outer diameter (OD) by 1.75 inch in inner diameter (ID) by 1.2 inch in thickness are mounted on a hollow molybdenum mandrel (1.75 inch OD by 1.00 inch ID). A 0.5 inch space is maintained between the bottom surface of each substrate and the top surface of the next substrate below it along the length of the mandrel and the mandrel OD is 1.50 inch between substrate positions.

Mounting the mandrel and substrates in the infiltration chamber: The mandrel with the substrates is hung onto a steel beam at the top of the chamber via (from top to bottom) an alumina electrical insulator and a 0.25 inch diameter graphite rod coupled to a 0.25 inch diameter molybdenum rod. A 5.55 inch OD by 5.31 inch ID quartz tube is centered on the bottom of the infiltration vacuum chamber, inside a water-cooled copper coil. The top flange of the chamber, carrying the mandrel and substrates, is lowered, placing said mandrel and substrates inside and at the center of said quartz tube and said coil.

Evacuation and purging of infiltration chamber: The vacuum chamber is closed and evacuated. It is purged with argon or other inert gas, such as nitrogen, and re-evacuated several times and left pumped under vacuum.

Degassing of substrates and chamber: A power of, for example, 1 kW at a frequency of, for example, 7.5 kHz is applied to the coil, so as to heat the mandrel to a temperature of approximately 200° C. The power and frequency are gradually raised to, for example, 10.5 kW and, for example, 8.4 kHz, respectively, so as to heat the mandrel to a temperature of about 1100° C. The power to the coil is interrupted and a flow of argon or nitrogen of, for example, 500 sccm is stabilized through the chamber at a pressure of, for example, 40 Torr. The coil is re-energized and degassing is continued. This procedure is repeated several times. The power to the coil is momentarily interrupted during large pressure variations to avoid arcing.

Evacuation and purging of precursor delivery line: The cyclopentane delivery line is evacuated, purged with argon or other inert gas and re-evacuated several times, and finally left under vacuum.

Starting precursor flow and carbon infiltration of the porous substrates: The power to the coil is adjusted to the desired value, for example, 10.5 kW at a frequency of 8.4 kHz, resulting in a mandrel temperature of about 1100° C., as noted above. The argon flow is gradually reduced to zero while cyclopentane vapor is introduced into the infiltration chamber through its delivery line (FIG. 2). Finally, a flow of pure cyclopentane is established through the infiltration chamber at, for example, 650 sccm and at a total pressure of, for example, 40 Torr. Deposition of carbon starts when cyclopentane is first introduced into the infiltration chamber.

Ending carbon infiltration: The precursor flow is gradually decreased while argon or nitrogen is introduced into the infiltration chamber. The infiltration chamber and the precursor delivery line are evacuated and purged several timeswith argon or nitrogen. Finally, the power to the coil is turned down and the susceptor and substrates allowed to cool either in vacuum or in flowing argon or nitrogen.

The following results were obtained in specific runs following the general procedure described above:

In Run I, three porous non-woven PAN carbon substrates, 4.12 inch OD by 1.75 inch ID by 1.2 inch thick were placed on a hollow molybdenum mandrel as described above and infiltrated with carbon. Cyclopentane was made to flow at 647 sccm and the total pressure in the chamber was maintained at an average of 48 Torr (between 2 and 97 Torr). A power of 10.5 kW was delivered to the coil at a frequency of 8.4 kHz. The temperature in the middle of the susceptor was estimated to be 1100° C. No insulating heat shields on the top and bottom of the susceptor were used. The run was interrupted after 4 h and then resumed for another 22 h for a total of 26 h. The substrates were mounted at the same axial locations on the susceptor during each cycle of the run and their weights were recorded prior to densification, after 4 h and after 26 h. Their volumes were measured by immersion in deionized water after 26 h. The increases in weight (after 0, 4 and 26 hours) and density (after 0 and 26 hours) are given in TABLE 1, below. The density of graphite ($\rho_{graphite}$) is 1.80 g/cm$^3$:

TABLE 1

| Disk No. | Weight (g) | | | Density (g/cm$^3$) | |
|---|---|---|---|---|---|
|  | 0 | 4 | 26 hrs. | 0 | 26 hrs. |
| 1 (top) | 91.4 | 99.4 | 215.0 | 0.43 | 1.01 |
| 2 (middle) | 89.3 | 109.8 | 335.6 | 0.41 | 1.54 |
| 3 (bottom) | 96.4 | 104.3 | 253.4 | 0.43 | 1.13 |

The average densification rate in the 22 h run was 1.75–3 times faster than in the first 4 h (see FIG. 3). There is residual open porosity in the densified carbon substrates, even after 26 hours, signifying that additional densification is possible without surface grinding. The net efficiency of the reaction in the last 22 h was 21%, vs. 10% in the first 4 h. This behavior is consistent with an inside-out densification front. By contrast, the opposite behavior is seen in the prior-art isothermal process, where the approach to final density slows down exponentially with time. X-ray diffraction results indicate a d spacing of 3.46 Å on disk #2 (non-graphitized) compared to 3.42 Å on a graphitized carbon substrate manufactured by prior art. Optical micrographs taken in polarized light show that the microstructure of the carbon added by CVI in disk #2 is rough-smooth laminar. This is determined by the extinction angle of the so-called "Maltese cross" pattern, which is 16°, compared to literature values of 20° for rough laminar and 10° for smooth laminar. The compressire strength of a 0.5 inch diameter by 1 inch long sample cored from disk #2 is 16.6 ksi, which is considered good for this density. Higher compresslye strength can be achieved at higher density. Another sample cored from disk #2 has been annealed in high vacuum for 4 h at 1800° C. with no weight loss within the measurement accuracy (0.1 g). The higher density of the middle disk compared to the two outer disks in this run is due to an axial temperature gradient of 20°–50° C. along the Mo susceptor, which can be significantly reduced with thermal insulation (see Run II). The amount of tar generated as a dark brown, viscous liquid is only about 4% of the total precursor flow.

In Run II, insulating heat shields (6 in FIG.1) were used. Three porous non-woven PAN carbon substrates, 4.12 inch OD by 1.75 inch ID by 1.2 inch thick were placed on a hollow molybdenum mandrel as in Run I and infiltrated with carbon. Cyclopentane was made to flow at 647 sccm and the total pressure in the chamber was maintained at 40 Torr. A power of 10.8 kW was delivered to the coil at a frequency of 8.4 kHz. The run lasted 30 hours. The increases in weight and density are given in TABLE 2, below:

TABLE 2

| Disk No: | Weight (g) 0 | Weight (g) 30 hrs. | Density (g/cm³) 0 | Density (g/cm³) 30 hrs. |
|---|---|---|---|---|
| 4 (top) | 109.5 | 332.7 | 0.46 | 1.39 |
| 5 (middle) | 106.2 | 335.2 | 0.45 | 1.43 |
| 6-1 (bottom)* | 103.8 | 50.3 | 0.47 | 1.60 |
| 6-2 | | 290.4 | | 1.52 |

*Disk #6 broke into two parts (6-1 and 6-2) during handling

The insulation placed on the top and bottom of the susceptor has essentially eliminated the disk-to-disk density variation seen in Run I without the additional insulation and all three disks are now substantially densified (see FIG.4). The smaller bottom-to-top decrease in density is probably due to depletion of the precursor concentration in the gas phase, which can be alleviated by adjusting the processing conditions. The net efficiency of the reaction in Run II is greater than 22%.

The above description of the apparatus and method are exemplary. The scope of the invention is only limited by the appended claims.

To summarize, the present invention provides a rapid, one-step process for vapor-phase densification of porous substrates and, in particular, carbon-carbon substrates suitable for aircraft brake pads. The CVI cycle time is reduced by a factor of 40–50 or higher compared to the prior art and no interruptions for surface grinding are necessary. A batch of, for example, 25 substrates can be densified in about 25 h, whereas in the prior art 600°–1200 h would be required. The ability to completely densify substrates in one day allows significant reductions in stock inventory and a "just-in-time" production operation. The present process can also be made into a continuous process, by straightforward extensions of the system shown in FIG. 1. There are no fundamental technical barriers to scale up both the substrate diameter and the number of substrates per run. The microstructure of the CVI carbon produced in the present process is rough-smooth laminar, which has excellent friction and wear properties and is the desired microstructure for brake pads.

Materials other than carbon-carbon, for example silicon carbide (SIC), can be densified using the present method, by choosing appropriate precursor(s) and processing conditions, such as pressure, flow-rate and temperature. To exploit the inherent speed of this process, the densified material needs to be sufficiently electrically conductive at the densification temperature so as to couple to the electric field induced by the current in the coil. Metallic, e.g. aluminum or titanium nitride, and semi-metallic materials, e.g. boron, are sufficiently conducting even at room temperature. Semiconductors, e.g. SiC and Si and certain ionic conductors, e.g. cubic zirconia, have an intermediate conductivity at room temperature but their conductivity increases exponentially with temperature, allowing them to be densified according to the present invention.

The efficiency of the present process for carbon-carbon is over 20%, which is ten times higher than in the prior art, resulting in substantial cost savings and significantly reduced emissions. The amount of tar formed is relatively small and the amount of soot almost insignificant. The tar formed can be readily drained and collected by proper design of the reaction chamber.

The densification in the present process proceeds approximately linearly with time at constant power conditions, whereas in the prior art the densification has a much slower and exponential time variation, with a very slow approach to the final density. In addition, the present process allows optimizing the densification rate by varying, for example, the power to the coil (to influence the temperature), using the instantaneous real-time weight gain of the substrates as input parameter. The same in-situ weight measurement allows an accurate determination of the end point of the reaction, whereas in the prior art there is no real-time in-situ detection of the end-point and the reaction is stopped at a pre-determined time, which may leave some substrates incompletely densified. Substrates of unequal diameter and/or thickness can be densified in the same run in the present process.

The present process can be carried out over a wide pressure range and, in particular, at much lower pressures than previously published thermal-gradient processes. The present process is also run at much lower temperatures than previously published thermal-gradient processes, but at higher temperature than isothermal processes, resulting in a much reduced cycle time with a lesser expense of energy.

We claim:

1. In the method for densifying a porous solid structure by infiltration with a gaseous compound which upon thermal decomposition forms a conducting solid residue, and thermally decomposing said compound within the pores of said structure, the steps comprising:
   a) establishing a thermal gradient within and across said porous structure;
   b) infiltrating said porous structure with a gas comprising said thermally decomposable compound, to affect deposition of solid conducting residue predominantly at the higher temperature zone within said porous structure; and
   c) progressively shifting said higher temperature zone toward the lower temperature zone as deposition of said solid residue proceeds, while maintaining the thermal gradient, by subjecting the densified zone to electromagnetic radiation at a frequency which inductively couples to the densified zone of said porous solid body.

2. The method of claim 1 conducted in a reaction vessel having cooled walls, wherein one side of said porous structure within the vessel is exposed to a heat source, while the other side is exposed to the cooled reactor wall, to thereby establish a thermal gradient within and across said porous structure.

3. The method of claim 2 wherein the heat source is a radio frequency receptor which is inductively coupled to electromagnetic radiation at a frequency which also inductively couples to the densified zone of said porous body.

4. The method of claim 3 for densifying a plurality of porous bodies which are in electrical contact with each other and which surround the receptor.

5. The method of claim 3 wherein the porous body is provided with an aperture which surrounds the receptor.

6. The method of claim 5 wherein the porous body is a porous carbon body.

7. The method of claim 6 wherein the thermally decomposable compound is a hydrocarbon having from 1 to about 8 carbon atoms.

8. The method of claim 5 wherein the porous body is an annulus-shaped porous carbon body.

9. The method of claim 8 wherein the thermally decomposable compound is methane.

10. The method of claim 8 wherein the thermally decomposable compound is cyclopentane.

* * * * *